United States Patent [19]

Tanaka

[11] 4,054,808

[45] Oct. 18, 1977

[54] VIBRATION DETECTING DEVICE HAVING A PIEZOELECTRIC CERAMIC PLATE AND A METHOD FOR ADAPTING THE SAME FOR USE IN MUSICAL INSTRUMENTS

[75] Inventor: Toshiharu Tanaka, Hirakata, Japan

[73] Assignee: Matsushita Electric Industrial Co., Ltd., Osaka, Japan

[21] Appl. No.: 604,611

[22] Filed: Aug. 14, 1975

[30] Foreign Application Priority Data

| | | |
|---|---|---|
| Aug. 19, 1974 | Japan | 49-99364 |
| Aug. 20, 1974 | Japan | 49-99924 |
| Aug. 20, 1974 | Japan | 49-99925 |
| Nov. 1, 1974 | Japan | 49-133570 |
| Nov. 11, 1974 | Japan | 49-136942 |
| Nov. 18, 1974 | Japan | 49-139843 |

[51] Int. Cl.[2] .......... H01L 41/04

[52] U.S. Cl. .......... 310/323; 310/326; 310/330; 310/366

[58] Field of Search .......... 310/8.2, 8.3, 8.5, 8.6, 310/8.7, 9.1, 9.4, 8.9; 340/10; 84/1.14, 1.16, DIG. 29

[56] References Cited

U.S. PATENT DOCUMENTS

| | | | |
|---|---|---|---|
| 2,480,535 | 8/1949 | Alois et al. | 310/8.7 X |
| 3,375,707 | 4/1968 | Neitz | 310/8.7 X |
| 3,582,692 | 6/1971 | Palini | 310/8.5 |
| 3,725,561 | 4/1973 | Paul | 84/1.16 |
| 3,736,632 | 6/1973 | Barrow | 310/8.2 X |
| 3,863,250 | 1/1975 | McCluskey, Jr. | 310/8.1 X |
| 3,912,954 | 10/1975 | Baird | 310/8.2 X |
| 3,928,777 | 12/1975 | Massa | 310/8.2 |

*Primary Examiner*—Mark O. Budd
*Attorney, Agent, or Firm*—Stevens, Davis, Miller & Mosher

[57] ABSTRACT

A vibration detecting device adapted to be mounted on a musical instrument, such as a guitar or a violin, or a mechanical conversion apparatus for detecting sound generated by the guitar or the like or other vibration is provided, which is of simple structure having a piezoelectric ceramic plate housed in a case, and has a high sensitivity and an excellent frequency characteristic. A method for adapting the vibration detecting device is also provided.

9 Claims, 21 Drawing Figures

VIBRATION DETECTING DEVICE HAVING A PIEZOELECTRIC CERAMIC PLATE AND A METHOD FOR ADAPTING THE SAME FOR USE IN MUSICAL INSTRUMENTS

The present invention relates to a vibration detecting device which detects mechanical vibrations and converts them to electrical signals, and more particularly the present invention provides a vibration detecting device suitable for a vibration detecting device for a musical instrument such as a guitar, violin or the like, and a method for adapting the vibration detecting device.

It is a first object of the present invention to provide a small size vibration detecting device which is simple in structure and can be manufactured at a low cost.

It is a second object of the present invention to provide a vibration detecting device which has a high sensitivity and a flat frequency characteristic and which is most suitable as a pickup for a musical instrument such as guitar, violin or the like.

It is a third object of the present invention to provide a vibration detecting device which can be used as a vibration detecting device for a musical instrument as well as a vibration detecting device for detecting the vibration of a mechanical apparatus.

It is a fourth object of the present invention to provide a method for adapting the characteristics of the vibration detecting device, such as the sensitivity, rise time, fall time or the like, in a very simple manner.

The present invention relates to a vibration detecting device for detecting the vibration of a machine, musical instrument or the like and provides such a vibration detecting device having a flat frequency characteristic and a high sensitivity particularly in a low frequency range.

The above and other objects, features and advantages of the present invention will become more apparent from the following detailed description of the preferred embodiments of the present invention when taken in conjunction with the accompanying drawings, in which.

Figure 17A:
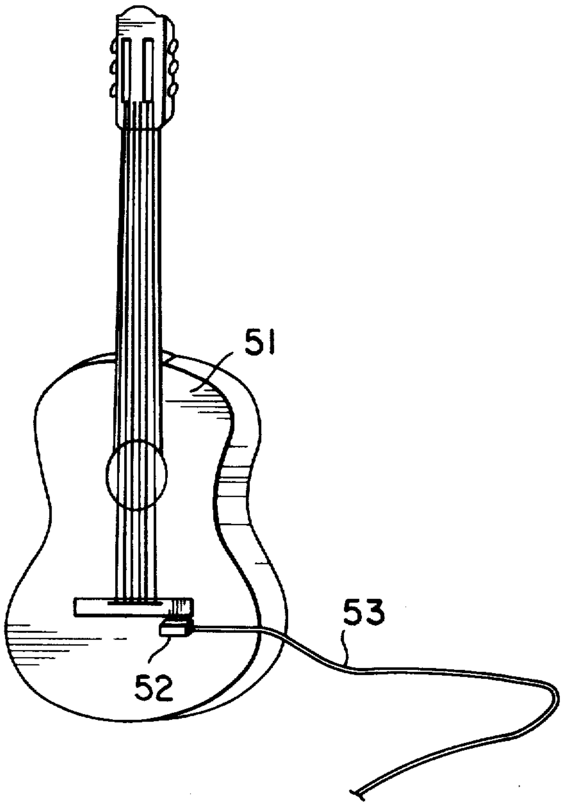
FIG. 17A PRIOR ART

FIGS. 17A and B are perspective views showing the mounting of the vibration detecting device on a conventional guitar.

Figure 18A:
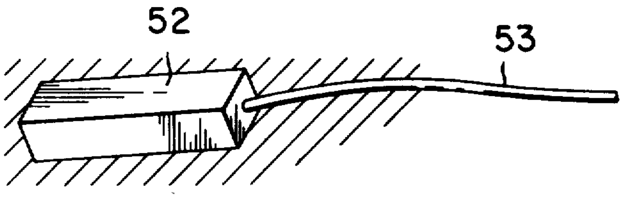
FIG. 18A PRIOR ART
Figure 18B:
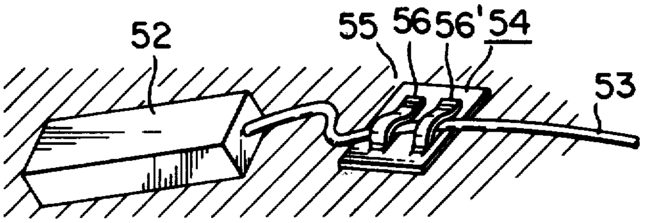

FIG. 18A is a perspective view showing the mounting of a prior art device shown in FIGS. 17A and B, and FIGS. 18B and C are perspective views of the embodiments of the present invention.

Figure 1:
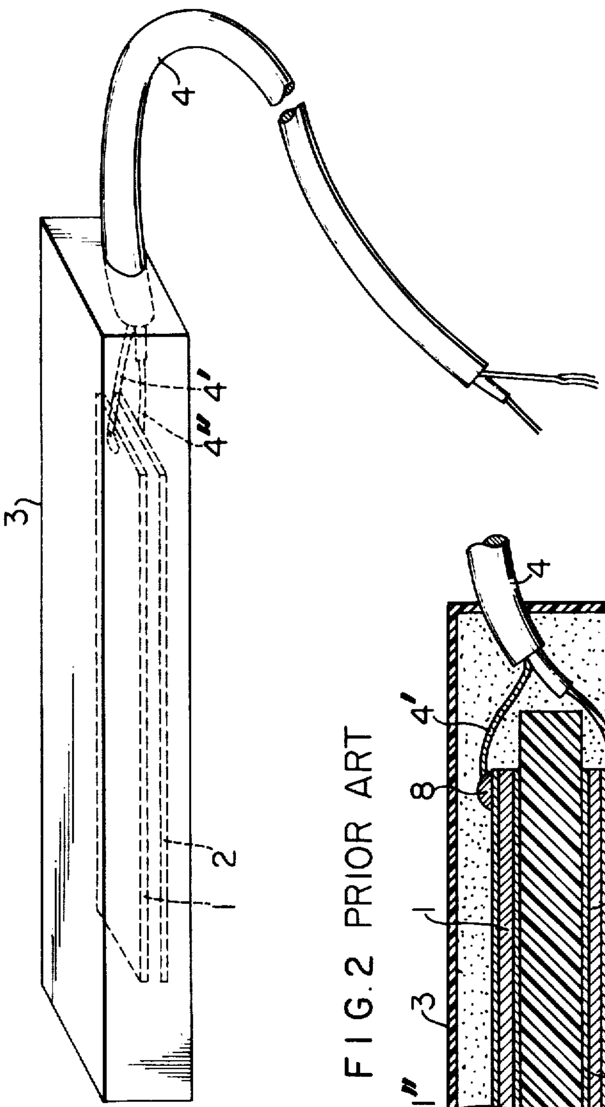
FIG.1 PRIOR ART
FIG. 1 is a perspective view of a prior art vibration detecting device.
Figure 2:
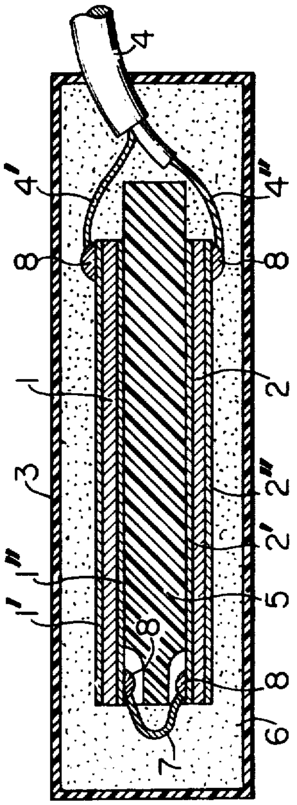
FIG.2 PRIOR ART
FIG. 2 is a sectional view thereof.

Referring first to FIGS. 1 and 2, a prior art vibration detecting device of the type described above is explained.

In FIGS. 1 and 2, 1 and 2 designate piezoelectric ceramic plates, 1', 1'', 2' and 2'' designate electrodes formed on the surfaces of the piezoelectric ceramic plates 1 and 2, 3 designates a case, 4 a coaxial cable, 4' a grounding lead wire, 4'' an internal wire, 5 a plastic plate of such material as epoxy or phenol resin, 6 epoxy resin filled between the case 3 and the piezoelectric ceramic plates 1, 2, and the lead wires 4', 4'', 7 a lead wire connecting the electrodes 1'', 2' of the piezoelectric ceramic plates 1, 2, and 8 designates solder or conductive bonding material.

When such a vibration detecting device is attached to an object, such as a machine, musical instrument or the like, having a vibrating plane parallel to the electrode planes of the piezoelectric ceramic plates 1 and 2, it can detect the vibration of the object. Namely, since the bending-mode of vibration is caused in the piezoelectric ceramic plates 1 and 2 through the vibration of the object, an electric signal is produced between the lead wire 4' and the internal wire 4'' connected to the electrodes 1' and 2'' of the piezoelectric ceramic plates. In the case of the prior art arrangement shown in FIG. 2, because the epoxy or phenol resin and the filling epoxy resin are hard, the sensitivity to relatively low frequency vibrations has been low. Also, because there exists a resonance point of the detector at a relatively high frequency, the vibration is propagated from the detector through an amplifier, a speaker, air, the musical instrument and back to the detector when the detector is used as a music instrument vibration detecting device, causing howling or deterioration of quality of sound or the emphasis of a particular sound.

The present invention is intended to eliminate such drawbacks of the prior art device and to provide a vibration detecting device having a flat frequency characteristic and a high sensitivity in a low frequency region.

Figure 3:
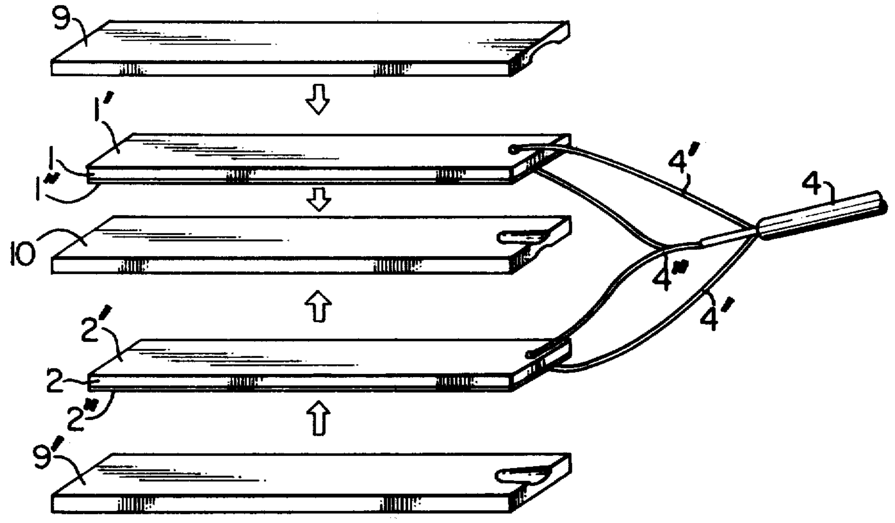
FIG. 3 is an exploded perspective view of a vibration detecting device in one embodiment of the present invention.
Figure 4:
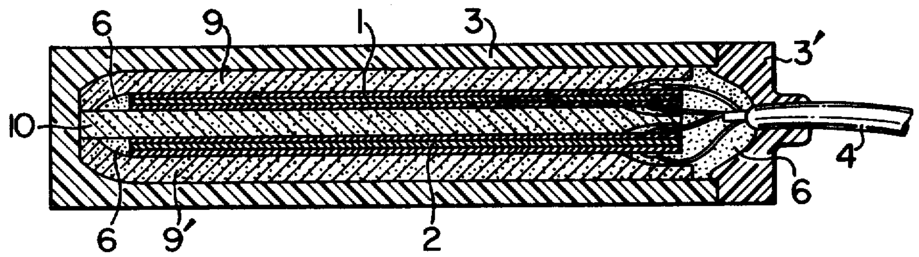
FIG. 4 is a sectional view thereof.

One embodiment of the present invention will now be described in conjunction with FIG. 3 in which those parts which are common to FIGS. 1 and 2 are represented by the same reference numerals. Referring to FIG. 3, the reference numerals 9, 9', 10 designate vibration absorbing plates of relatively soft material, such as cork board, resin or rubber board including asbestos, or rubber board, which absorbs the vibration. These are bonded together by an adhesive in the directions of the arrows and placed in a case 3 to complete a vibration detecting device as shown in FIG. 4. In FIG. 4, 3' designates a lid of the case 3 and 6 designates the adhesive material. As shown in FIG. 4, the interior of the case 3 is reduced at its tip end and periphery so that the peripheries of the vibration absorbing plates 9, 9', 10 contact each other to surround the piezoelectric ceramic plates 1 and 2.

Figure 5:
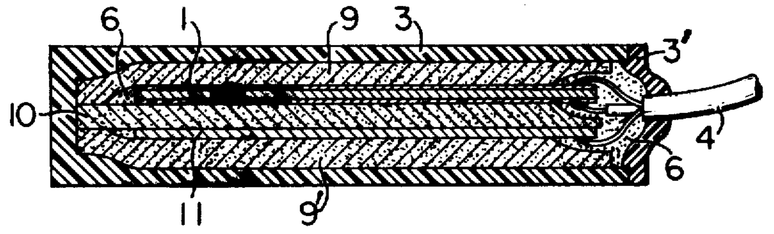
FIGS. 5 through 7 are sectional views of other embodiments of the present invention.
Figure 6:
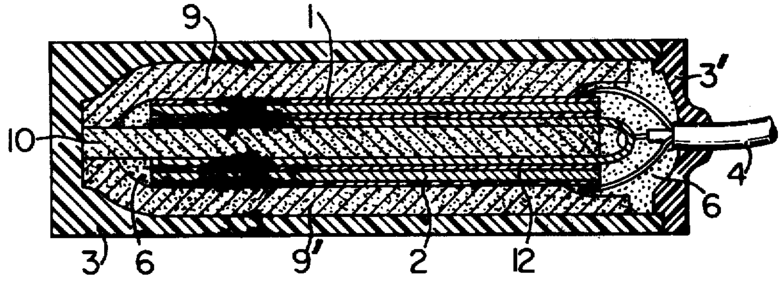
Figure 7:
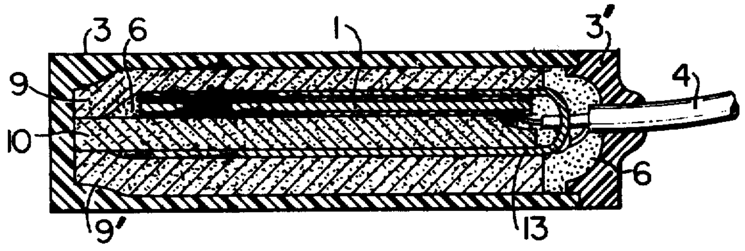

Other embodiments of the present invention are explained in conjunction with FIGS. 5, 6 and 7.

In an embodiment shown in FIG. 5, the piezoelectric ceramic plate 1 is held between the vibration absorbing plates 9, 9' and 10, and a shielding metal plate 11 is interleaved between the vibration absorbing plates 10 and 9'.

In an embodiment shown in FIG. 6, U-shaped metal plates 12 are interleaved between the piezoelectric ceramic plates 1, 2 and the vibration absorbing plate 10.

In an embodiment shown in FIG. 7, U-shaped metal plates 13 are interleaved between the vibration absorbing plate 9 and the piezoelectric ceramic plate 1 and between the vibration absorbing plates 9' and 10. The vibration detecting devices of the present invention thus constructed offer the following advantages.

A. Since the piezoelectric ceramic plate or the detecting element comprising the bonded piezoelectric ceramic plate and metal plate is surrounded by the vibration absorbing plate, high frequency vibrations are propagated only with difficulty so that when it is used as a music instrument vibration detecting device a soft tone is produced and the resonance output is very small even when a resonance point of the detecting element is at a high frequency. Further, the sensitivity at a high frequency is reduced suppressing howling.

B. Since the shape of the vibration absorbing plate is simple it is possible to select the material from the standpoint of vibration absorbing ability without paying attention to the molding of the plate and hence a vibration detecting device of an excellent characteristic can be provided.

C. It is easy to assemble.

In the prior art device shown in FIG. 2, since there exists hard epoxy resin 6 between the vibration detecting element and the case 3, there are drawbacks in that resonance occurs at a high frequency while the sensitivity to low frequency vibration is low, and the frequency characteristic is not flat.

According to another embodiment of the present invention, in order to eliminate the above drawbacks of the prior art device, resin 6 having foaming material mixed thereto is interleaved between the vibration detecting element and the case 3. As the foaming material, "Erozeam" used to prevent the flow of the adhesive material may be preferably used.

In the above embodiment, in place of the plastic plate 5 a molded resin plate having foaming material mixed thereto may be used.

According to the embodiments of the present invention described above, the resonance at a high frequency is prevented and the reduction of the sensitivity at a low frequency is also prevented so that an advantageous result of a flat frequency characteristic is obtained.

Figure 8:
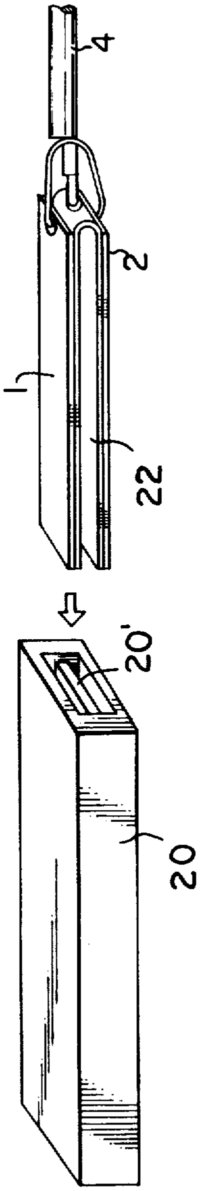
FIG. 8 is an exploded perspective view of a major part of a vibration detecting device in another embodiment of the present invention.
Figure 9:
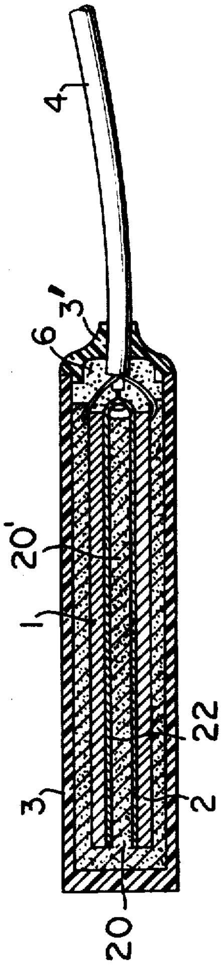
FIG. 9 is a sectional view thereof.

FIGS. 8 and 9 show another embodiment of the present invention, in which those parts common to FIGS. 1 and 2 are represented by the identical reference numerals. Referring to FIG. 8, 22 designates a metal plate formed in U-shape, and the piezoelectric ceramic plates 1 and 2 are tightly bonded to outer surfaces of the metal plate 22 by adhesive material. The electrode on the bottom of the piezoelectric ceramic plate 1 and the metal plate 22, and the electrode on the top of the piezoelectric ceramic plate 2 and the metal plate 22, respectively, are electrically connected through the adhesive material. 20 designates an envelope-like holder comprising vibration absorbing material such as rubber or resin including cork, asbestos or the like, formed into an envelope shape, and a supporting member 20' is integrally formed at a center of the envelope-like holder 20. As shown in FIG. 9, the U-shaped metal plate 22 is housed in the envelope-like holder 10 to hold the supporting member 10' by the U-shaped metal plate. Since a small amount of adhesive material is filled in the envelope-like holder 20, the metal plate 22 is affixed within the envelope-like holder 20. On a surface of the envelope-like holder housing the metal plate 22 therein as described above, adhesive material is applied and the envelope-like holder 20 is placed in the case 3 and fixed thereto. 6 designates epoxy resin filled in an opening of the case 3 and 3' designates a lid of the case 3.

Figure 10:
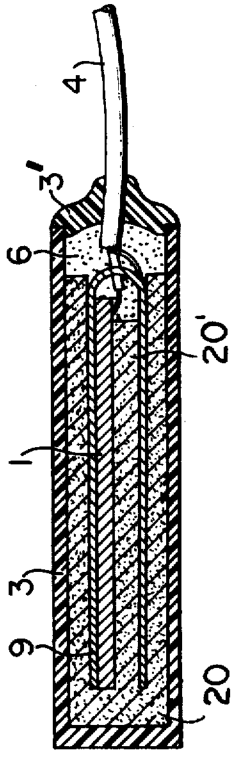
FIG. 10 is a sectional view of a further embodiment of the present invention.

FIG. 10 shows an other embodiment of the present invention in which the piezoelectric ceramic plate 1 is bonded to the inside of one piece of the U-shaped metal plate 22, the other piece of the U-shaped metal plate 22 serving as a shielding plate.

Figure 11:
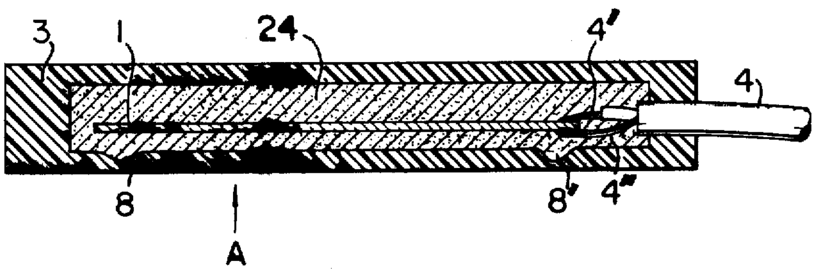
FIG. 11 is a longitudinal sectional view of a vibration detecting device in a still further embodiment of the present invention.
Figure 12:
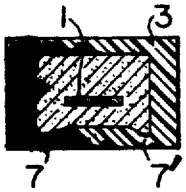
FIG. 12 is a cross sectional view thereof.

FIGS. 11 and 12 show another embodiment of the present invention, which will now be described in conjunction with the drawings, in which 1 designates the piezoelectric ceramic plate, 3 the case, 4 the coaxial cable, 4' the internal wire, 4" the grounding wire and 24 the vibration absorbing material. The vibration detecting device according to the present embodiment is formed with grooves 7, 7', 8, 8' near the periphery of the inner side of the vibration detecting section A in the case 3.

Figure 13:
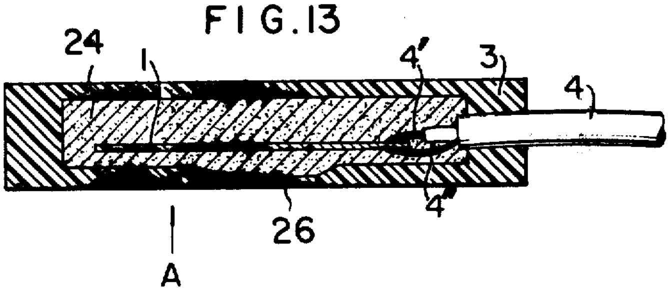
FIGS. 13 and 14 are longitudinal sectional views of vibration detecting devices in accordance with still other embodiments of the present invention, respectively.

The detecting section defined between the grooves 8 and 8' is easily vibrated at a low frequency region owing to its thick structure. FIG. 13 shows a further embodiment of the present invention, in which similar references designate the same parts as shown in FIGS. 11 and 12. In the embodiment a recess 26 is formed in the inner side of the vibration detecting section A in the case 3 at a position corresponding to a center of the piezoelectric ceramic plate.

Figures 14, 15, 16:
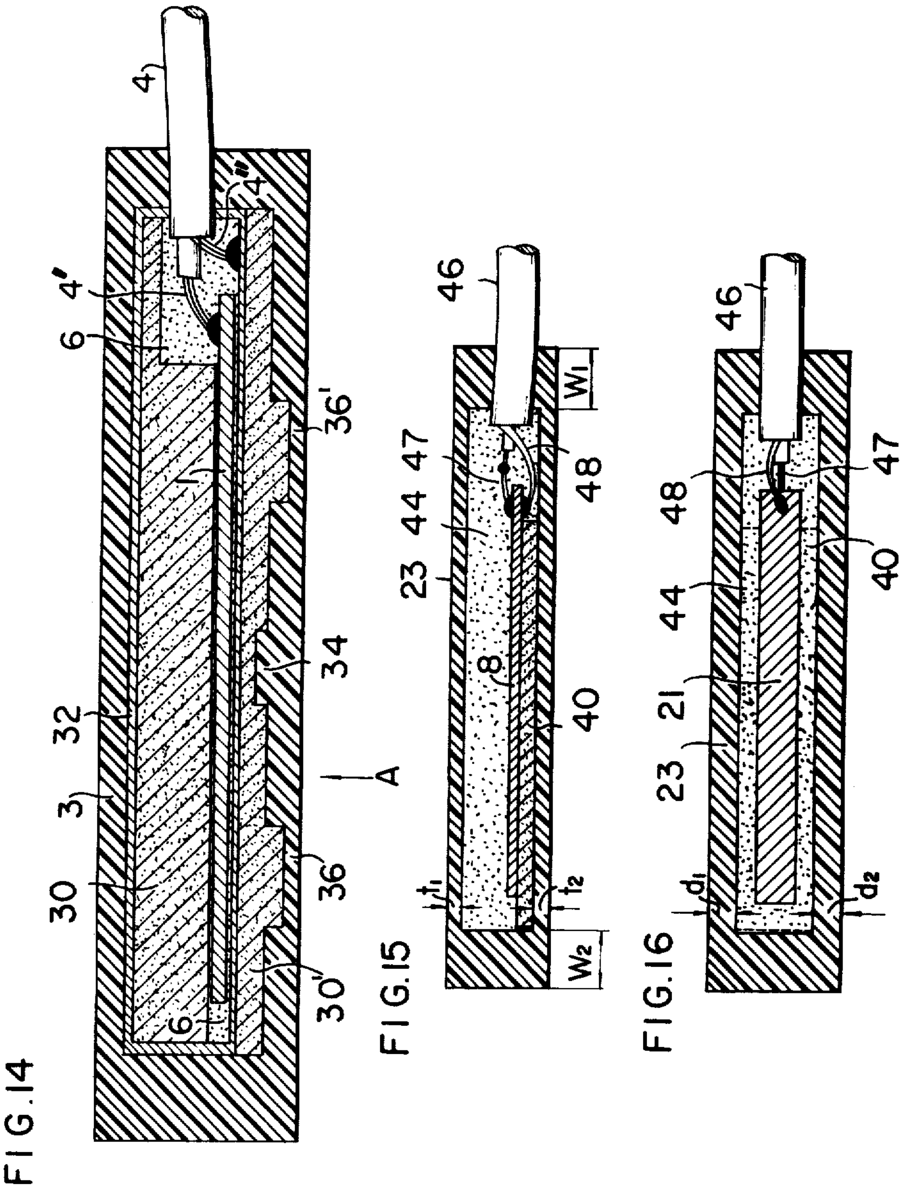
FIG. 15 is a cross sectional view of a vibration detecting device in accordance with still another embodiment of the present invention.
FIG. 16 is a longitudinal sectional view thereof.

Owing to the thin thickness of the recessed portion, it is easily vibrated at a high frequency region. FIG. 14 shows still another embodiment of the present invention, in which similar references designate the same parts as shown in the previous embodiment. In the drawing, 30 and 10' designate spacers of relatively soft material such as rubber, soft plastic, cork or the like, 32 designates a box-like metal foil for shielding, to which the piezoelectric ceramic plate 1 is bonded, the bonding surface being electrically conductive. 34, 36 and 36' designate a raised portion and recessed portions. The piezoelectric ceramic plate 1 is bonded to the inner face of the box-like metal foil 32 and the spacer 30 of plate or block shape made of rubber or cork is filled in the space and bonded to the adhesive material 24, and the vibration detecting unit thus constructed is then bonded and affixed to the assembly comprising the case 3 having the raised portion 34 and the recessed portions 36, 36' formed in the inner face of the vibration detecting section A, the spacer 30' being fitted to the inner surface of the case 3.

In the embodiment shown in FIGS. 11 and 12, by the provision of the grooves 7, 7', 8, 8' near the periphery of the inner surface of the vibration detecting section A of the case 3, the sensitivity at a low frequency region can be enhanced. In this case, when the filling adhesive material 24 is softer than the material of the case 3, a remarkable effect is obtained in that the sensitivity at a low frequency range is further enhanced. In the embodiment shown in FIG. 13, not only the overall sensitivity is enhanced, but the sensitivity at a high frequency range is further enhanced. This effect is remarkable when the filling adhesive material 24 is softer than the material of the case 3. In the embodiment shown in FIG. 14, not only the overall sensitivity is enhanced but the sensitivity at a low frequency range is further enhanced. This effect is remarkable when the material of the spacers 30, 30' as softer than the material of the case 3.

While the grooves or the raised and recessed portions are formed in the inner surface of the vibration detecting section A of the case 3, they may be formed on the outer surface of the vibration detecting section A of the case to obtain similar result. Further, a similar result is obtainable when the filling adhesive material 6 and the fillers such as the spacers 10, 10' are not provided over the entire inner surface of the case 3.

FIGS. 15 and 16 show another embodiment of the present invention, in which 21 designates a piezoelectric ceramic plate located in a case 23 of plastic or wood. Vibration absorbing material 30 of such as rubber or plastic is bonded to the inner wall of the case 23, and the piezoelectric ceramic plate 21 is bonded thereon. 44 designates filling material, such as epoxy resin mixed with foaming material, filled in the void in the case 23, and 46 designate a shield wire. 47 and 48 designate lead wires soldered to the electrodes on the surface of the piezoelectric ceramic plate 21.

The case 23 is constructed such that the thicknesses $t_1$, $t_2$ of the planes which are parallel to the plane of the piezoelectric ceramic plate 21 are thinner than the thicknesses $d_1$, $d_2$, $w_1$, $w_2$ of other planes.

While the piezoelectric ceramic plate 21 is intimately contacted to the inner wall of the case 23 through the vibration absorbing material 10 in the above embodiment, it may be intimately contacted directly to the inner wall of the case 23.

According to the vibration detecting device of the above embodiment, since the case of the vibration detecting device is constructed such that the thickness of the planes parallel to the plane of the peizoelectric ceramic plate is thinner than the other planes, the flexing or bending vibrations on the other planes do not strongly appear and the vibration energy does not escape and the vibration energy on the bottom surface effectively is used to cause the bending operation of the piezoelectric ceramic plate, resulting in a high sensitivity. Further the amplitude at the antinode of the vibration wave on the bottom surface of the case is not reduced and a high sensitivity is assured. Thus, since a sufficient sensitivity is obtainable from a single piezoelectric ceramic plate, it is simple in structure and easy to manufacture. The above effect is remarkable when the density of the case material is higher than that of the filling material or when the material of the filling material is more flexible than the case.

In general, in the vibration detecting device of the type described above, there are lead wires for deriving an electrical signal from the vibration detecting device. In such an instance, there has been inconvenience in that the lead wires contact a portion of the body of an instrument player or contact the guitar body so that the vibration of the lead wires is propagated to the vibration detecting device, creating noise. A similar inconvenience has been encountered when the vibration detecting device of the type described above was attached to other musical instruments or machines.

Figure 17B:
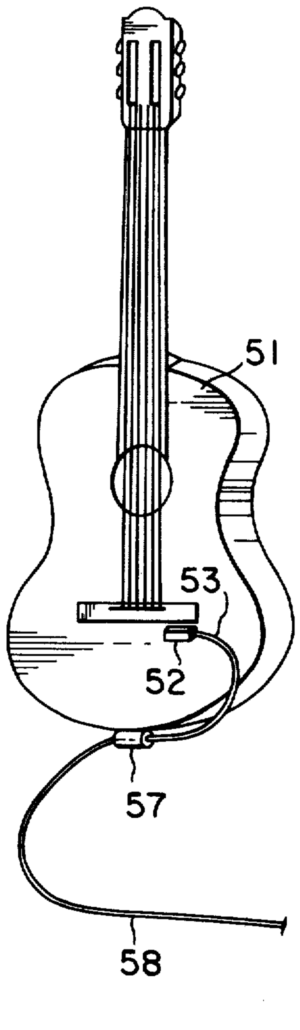
FIG. 17B PRIOR ART

FIG. 17A shows a guitar to which a prior art vibration detecting device is attached. In FIG. 17A, 51 designates a guitar, and 52 designates a vibration detecting device bonded to a frame of the guitar 1. 53 designates a lead wire (shielded wire) having one end connected to the vibration detecting device 52, the other end of the lead wire 53 being connected to an amplifier. In another example of the prior art shown in FIG. 17B, a connector 57 is fixed to the guitar 1 and the vibration detecting device 52 is connected to the connector 57 by the lead wire 53, and a cord 58 is removably coupled to the connector 57.

Figure 18C:
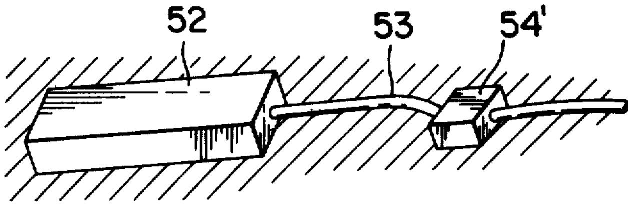

FIG. 18 shows the guitars to which the vibration detecting devices are mounted, in which FIG. 18A shows the prior art as shown in FIGS. 17A and B, and FIGS. 18B and C show the embodiments according to the present invention. In FIGS. 18A, B and C, 52 designates the vibration detecting device, 53 the lead wire, and 54, 54' the retainers for the lead wire 53. The retainer 54 shown in the embodiment of FIG. 18B is constructed by stamped-out portions 6, 6' by which the lead wire 53 is retained. The retainer 4 is bonded to the guitar, and that portion of the lead wire 53 which lies between the retainer 54 and the vibration detecting device 53 is slackened. The retainer 54' shown in the embodiment of FIG. 18C comprises a rubber or plastic block having an aperture therein through which the lead wire 53 is passed for fixing.

By fixing the lead wire near the vibration detecting device, the vibration occuring when the lead wire contacts with a player body or the instrument body does not propagate to the vibration detecting device and the occurrence of noise is prevented.

The effect of noise suppression is further enhanced by slackening the lead wire portion between the retainer and the vibration detecting device. Where the lead wire is fixed by the stamped-out portion of the retainer of the embodiment shown in FIG. 18B, the same effect is obtainable whether one or two stamped-out portions are used. The material of the retainer may be metal, rubber, plastic or adhesive tape.

While the above embodiment has been described in conjunction with the guitar, the same effect is obtainable with other musical instruments or machines. While both the vibration detecting device and the retainer are attached to a vibrating object or guitar in the above embodiment, the same effect is obtained when the vibration detecting device and the retainer are attached to different bodies.

Where the bottom surface of the vibration detecting device of the present invention is to be attached to a musical instrument or the like, the sensitivity is increased as the distance from the bottom surface of the case to the piezoelectric ceramic plate is shortened because the vibration of the musical instrument is more strongly propagated. Accordingly, it has been noticed by the inventor that the sensitivity is enhanced by cutting away the entire region, central portion or peripheral portion of the bottom surface of the case by grinding or other means. This effect is remarkable particularly when the vibration propagating material is softer than the case material. The same effect is obtainable when the top surface of the case is cut away by grinding or other means, although the effect is not considerable.

Similarly, when the bottom surface of the case is to be attached to the musical instrument or the like, the sensitivity is enhanced and the tracking characteristic to the vibration of the musical instrument is also enhanced by cutting away the side surface of the case. Namely, the sensitivity is enhanced and the rise time and fall time are shortened. This effect is remarkable when the vibration propagating material is softer than the case material.

What is claimed is:

1. A vibration detecting device, comprising:
a U-shaped metal plate electrode;
a piezoelectric ceramic plate;
conductive bonding means bonding said ceramic plate to one leg of said metal plate; and
an envelope-like vibration absorbing material having a support member at a center thereof, said metal plate being inserted into said envelope-like vibration absorbing material, said support member being held by at least part of said metal plate and said vibration absorbing material being housed in said case.

2. A vibration detecting device according to claim 1, further comprising a second piezoelectric ceramic plate conductively bonded to a second leg of said U-shaped metal plate.

3. A vibration detecting device according to claim 2, wherein said piezoelectric ceramic plates are each bonded to the outer surfaces of the respective legs of said U-shaped metal plate.

4. The vibration detecting device according to claim 1, wherein said piezoelectric ceramic plate is bonded to the interior surface of said one leg of said U-shaped metal plate, whereby said ceramic plate is shielded by said U-shaped metal plate electrode.

5. A vibration detecting device, comprising:
at least one piezoelectric ceramic plate;
a U-shaped metal plate electrode;
conductive bonding means bonding said piezoelectric ceramic plate to one leg of said U-shaped metal plate electrode for restricting vibration of the bonded surface portion of said ceramic plate and for permitting vibration of the opposite surface portion of said ceramic plate;
a case housing said ceramic and metal plates;
a vibration damping material supporting said ceramic and metal plates within said case and spaced from the interior surfaces of said case; and
electrical conductor means coupled to said ceramic plate and extending through and out of said case, said ceramic plate being bonded to the inside surface of the leg portion of said U-shaped metal plate electrode whereby said ceramic plate is shielded by said electrode.

6. A vibration detecting apparatus having a substantially flat frequency characteristic in the audio frequency range, comprising:
at least one piezoelectric ceramic plate having electrodes formed on two surfaces thereof;
a case housing said piezoelectric ceramic plate, said case comprising: first and second opposed side walls having thicknesses $t_1$ and $t_2$, respectively, said first side wall comprising a vibration detecting surface parallel to said piezoelectric ceramic plate; third and fourth opposed side walls having thicknesses $d_1$ and $d_2$, respectively; and fifth and sixth opposed side walls having thicknesses $w_1$ and $w_2$, respectively; wherein $t_1$ and $t_2$ are less than $d_1$ and $d_2$, $w_1$ and $w_2$ for effectively causing bending vibrations of said first side wall and for preventing bending vibrations of said third and fourth side walls;
electrical leads connected to said electrodes and extending through and out of said case; and
a vibration damping material substantially surrounding said piezoelectric ceramic plate and supporting said plate in and spaced from said case for damping transmission of high frequency vibrations through said case to said plate to suppress unfavorable resonances in the high frequency regions and flatten the frequency characteristic in the low frequency region.

7. A vibration detecting apparatus having a substantially flat frequency characteristic in the audio frequency range, comprising:
at least one piezoelectric ceramic plate having electrodes formed on two surfaces thereof;
a case housing said piezoelectric ceramic plate;
electrical leads connected to said electrodes and extending through and out of said case; and
a vibration damping material substantially surrounding said piezoelectric ceramic plate and supporting said plate in and spaced from said case for damping transmission of high frequency vibrations through said case to said plate to suppress unfavorable resonances in the high frequency regions and flatten the frequency characteristic in the low frequency region, said vibration damping material comprising three vibration damping plates; and said at least one ceramic plate being sandwiched between the first and second damping plates and a shielding metal plate being sandwiched between the second and third damping plates.

8. A vibration detecting apparatus having a substantially flat frequency characteristic in the audio frequency range, comprising:
at least one piezoelectric ceramic plate having electrodes formed on two surfaces thereof;
a case housing said piezoelectric ceramic plate;
electrical leads connected to said electrodes and extending through and out of said case; and
a vibration damping material substantially surrounding said piezoelectric ceramic plate and supporting said plate in and spaced from said case for damping transmission of high frequency vibrations through said case to said plate to suppress unfavorable resonances in the high frequency regions and flatten the frequency characteristic in the low frequency region, said vibration damping material comprising three vibration damping plates, a first piezoelectric ceramic plate being sandwiched between first and second damping plates and a second piezoelectric ceramic plate being sandwiched between second and third damping plates.

9. A vibration detecting apparatus having a substantially flat frequency characteristic in the audio frequency range, comprising:
at least one piezoelectric ceramic plate having electrodes formed on two surfaces thereof;
a case housing said piezoelectric ceramic plate;
electrical leads connected to said electrodes and extending through and out of said case, said case comprising an operative vibratory side wall defining inside and outside surface portions of said case, and at least one of said surface portions being formed with slots or raised and recessed portions for attenuating or strengthening a predetermined range of vibration frequency to obtain a flat frequency characteristic of said detecting device; and
a vibration damping material substantially surrounding said piezoelectric ceramic plate and supporting said plate in and spaced from said case for damping transmission of high frequency vibrations through said case to said plate to suppress unfavorable resonances in the high frequency regions and flatten the frequency characteristic in the low frequency region.

* * * * *